(12) United States Patent
Loboda et al.

(10) Patent No.: US 8,940,614 B2
(45) Date of Patent: Jan. 27, 2015

(54) SIC SUBSTRATE WITH SIC EPITAXIAL FILM

(71) Applicant: Dow Corning Corporation, Midland, MI (US)

(72) Inventors: Mark J. Loboda, Bay City, MI (US); Jie Zhang, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 14/213,888

(22) Filed: Mar. 14, 2014

(65) Prior Publication Data

US 2014/0264384 A1     Sep. 18, 2014

Related U.S. Application Data

(60) Provisional application No. 61/798,819, filed on Mar. 15, 2013.

(51) Int. Cl.
| H01L 21/76 | (2006.01) |
| H01L 21/20 | (2006.01) |
| H01L 21/02 | (2006.01) |
| H01L 21/3065 | (2006.01) |
| H01L 21/66 | (2006.01) |
| H01L 29/16 | (2006.01) |

(52) U.S. Cl.
CPC .... *H01L 21/02529* (2013.01); *H01L 21/02378* (2013.01); *H01L 21/0262* (2013.01); *H01L 21/3065* (2013.01); *H01L 22/26* (2013.01); *H01L 29/1608* (2013.01)
USPC ............ 438/413; 438/478; 438/481; 117/84; 117/90; 117/95

(58) Field of Classification Search
USPC ........ 438/149, 413, 478, 481; 117/84, 90, 95, 117/103, 104
See application file for complete search history.

(56) References Cited

U.S. PATENT DOCUMENTS

| 2,854,364 A | 9/1958 | Ley |
| 3,691,694 A | 9/1972 | Goetz et al. |
| 4,582,561 A | 4/1986 | Ioku et al. |

(Continued)

FOREIGN PATENT DOCUMENTS

| CN | 101724344 | 6/2010 |
| CN | 102107391 | 6/2011 |

(Continued)

OTHER PUBLICATIONS

Kordina et al. ("SiC epitaxial growth on lager area substrates: History and evolution", Silicon Carbide Epitaxy, 2012, pp. 1-25).*

(Continued)

*Primary Examiner* — Hsien Ming Lee
(74) *Attorney, Agent, or Firm* — Nixon Peabody LLP

(57) ABSTRACT

A method of forming an epitaxial SiC film on SiC substrates in a warm wall CVD system, wherein the susceptor is actively heated and the ceiling and sidewall are not actively heated, but are allowed to be indirectly heated by the susceptor. The method includes a first process of reaction cell preparation and a second process of epitaxial film growth. The epitaxial growth is performed by flowing parallel to the surface of the wafers a gas mixture of hydrogen, silicon and carbon gases, at total gas velocity in a range 120 to 250 cm/sec.

20 Claims, 6 Drawing Sheets

(56) References Cited

U.S. PATENT DOCUMENTS

| | | |
|---|---|---|
| 4,855,254 A | 8/1989 | Eshita et al. |
| 4,866,005 A | 9/1989 | Davis et al. |
| 4,912,063 A | 3/1990 | Davis et al. |
| 4,912,064 A | 3/1990 | Kong et al. |
| 5,679,153 A | 10/1997 | Dmitriev et al. |
| 5,709,745 A | 1/1998 | Larkin et al. |
| 5,888,887 A | 3/1999 | Li et al. |
| 5,895,583 A | 4/1999 | Augustine et al. |
| 5,899,743 A | 5/1999 | Kai et al. |
| 5,942,445 A | 8/1999 | Kato et al. |
| 5,944,890 A | 8/1999 | Kitou et al. |
| 5,954,881 A | 9/1999 | Burk, Jr. et al. |
| 6,196,901 B1 | 3/2001 | Minami |
| 6,352,927 B2 | 3/2002 | Kishimoto |
| 6,534,026 B2 | 3/2003 | Vodakov et al. |
| 6,562,127 B1 | 5/2003 | Kud et al. |
| 6,579,359 B1 | 6/2003 | Mynbaeva et al. |
| 6,583,050 B2 | 6/2003 | Wenski et al. |
| 6,723,166 B2 | 4/2004 | Kuhn et al. |
| 6,827,638 B2 | 12/2004 | Kiuchi et al. |
| 6,861,360 B2 | 3/2005 | Wenski et al. |
| 6,899,762 B2 | 5/2005 | Wenski et al. |
| 7,081,420 B2 | 7/2006 | Kamata et al. |
| 7,294,324 B2 | 11/2007 | Powell et al. |
| 7,314,520 B2 | 1/2008 | Powell et al. |
| 7,314,521 B2 | 1/2008 | Powell et al. |
| 7,316,747 B2 | 1/2008 | Jenny et al. |
| 7,323,051 B2 | 1/2008 | Hobgood et al. |
| 7,399,217 B1 | 7/2008 | Godshall |
| 7,422,634 B2 | 9/2008 | Powell et al. |
| 7,438,760 B2 | 10/2008 | Bauer et al. |
| 7,449,065 B1 | 11/2008 | Powell et al. |
| 7,513,819 B2 | 4/2009 | Kiuchi et al. |
| 7,531,433 B2 | 5/2009 | Ellison et al. |
| 7,935,614 B2 | 5/2011 | Schauer et al. |
| 8,075,647 B2 | 12/2011 | Kawasaki et al. |
| 8,165,706 B2 | 4/2012 | Pitney |
| 8,221,549 B2 | 7/2012 | Maruyama |
| 8,384,090 B2 | 2/2013 | Powell et al. |
| 8,395,164 B2 | 3/2013 | Murphy et al. |
| 8,435,866 B2 | 5/2013 | Nishiguchi et al. |
| 8,436,366 B2 | 5/2013 | Harada et al. |
| 8,716,718 B2 * | 5/2014 | Momose et al. ............ 257/77 |
| 2002/0083892 A1 | 7/2002 | Kondo et al. |
| 2003/0070611 A1 | 4/2003 | Nakamura et al. |
| 2004/0081805 A1 | 4/2004 | Furihata et al. |
| 2004/0134418 A1 | 7/2004 | Hirooka |
| 2004/0266057 A1 | 12/2004 | Nagasawa |
| 2005/0059247 A1 | 3/2005 | Ikenaka |
| 2006/0102068 A1 | 5/2006 | Tsvetkov et al. |
| 2006/0107890 A1 | 5/2006 | Hobgood et al. |
| 2006/0118037 A1 | 6/2006 | Powell et al. |
| 2006/0249073 A1 | 11/2006 | Asaoka et al. |
| 2006/0267024 A1 | 11/2006 | Murphy et al. |
| 2007/0176531 A1 | 8/2007 | Kinoshita et al. |
| 2007/0221614 A1 | 9/2007 | Sumakeris |
| 2007/0262322 A1 | 11/2007 | Nakabayashi et al. |
| 2007/0290211 A1 | 12/2007 | Nakayama et al. |
| 2008/0008641 A1 | 1/2008 | Leonard et al. |
| 2008/0217627 A1 | 9/2008 | Friedrichs et al. |
| 2008/0220620 A1 | 9/2008 | Kawada et al. |
| 2008/0261401 A1 | 10/2008 | Kerr et al. |
| 2008/0318359 A1 | 12/2008 | Yonezawa et al. |
| 2009/0038541 A1 | 2/2009 | Robbins et al. |
| 2009/0085044 A1 | 4/2009 | Ohno et al. |
| 2009/0114148 A1 | 5/2009 | Stahlbush et al. |
| 2009/0124060 A1 | 5/2009 | Nagaya et al. |
| 2009/0134405 A1 | 5/2009 | Ota et al. |
| 2009/0302328 A1 | 12/2009 | Ohno et al. |
| 2009/0321747 A1 | 12/2009 | Murphy et al. |
| 2009/0324896 A1 | 12/2009 | Kato |
| 2010/0080956 A1 | 4/2010 | Fujimoto et al. |
| 2010/0119849 A1 | 5/2010 | Nakamura et al. |
| 2010/0291756 A1 | 11/2010 | Haeberlen et al. |
| 2010/0295059 A1 | 11/2010 | Fujimoto et al. |
| 2011/0031505 A1 | 2/2011 | Harada et al. |
| 2011/0206929 A1 | 8/2011 | Nakabayashi et al. |
| 2011/0233562 A1 | 9/2011 | Harada et al. |
| 2011/0237078 A1 | 9/2011 | Hirooka |
| 2011/0284871 A1 | 11/2011 | Harada et al. |
| 2012/0025153 A1 | 2/2012 | Hirose et al. |
| 2012/0031330 A1 | 2/2012 | Tsumori et al. |
| 2012/0060751 A1 | 3/2012 | Urakami et al. |
| 2012/0061686 A1 | 3/2012 | Nishiguchi et al. |
| 2012/0070605 A1 | 3/2012 | Sasaki et al. |
| 2012/0070968 A1 | 3/2012 | Shibagaki et al. |
| 2012/0103249 A1 | 5/2012 | Gupta et al. |
| 2012/0128892 A1 | 5/2012 | Toyoda et al. |
| 2012/0184113 A1 | 7/2012 | Inoue et al. |
| 2012/0241766 A1 | 9/2012 | Ohtsuka et al. |
| 2012/0248463 A1 | 10/2012 | Zhang |
| 2012/0280254 A1 * | 11/2012 | Muto et al. ............ 257/77 |
| 2012/0285370 A1 | 11/2012 | Gupta et al. |
| 2013/0020585 A1 | 1/2013 | Ishibashi |
| 2013/0029158 A1 | 1/2013 | Aigo et al. |
| 2013/0032822 A1 | 2/2013 | Ishibashi |
| 2013/0071643 A1 | 3/2013 | Harada et al. |
| 2013/0099253 A1 | 4/2013 | Ohtsuka et al. |
| 2013/0122692 A1 | 5/2013 | Imai et al. |
| 2013/0126906 A1 | 5/2013 | Tomita et al. |
| 2014/0054609 A1 | 2/2014 | Burk et al. |

FOREIGN PATENT DOCUMENTS

| | | |
|---|---|---|
| CN | 102569055 | 7/2012 |
| CN | 102899723 | 1/2013 |
| DE | 102009016132 | 10/2010 |
| EP | 0712150 | 5/1996 |
| EP | 0795050 | 7/1999 |
| EP | 0967304 | 12/1999 |
| EP | 1039512 | 3/2000 |
| EP | 1179620 | 2/2002 |
| EP | 0954623 | 5/2002 |
| EP | 1215730 | 6/2002 |
| EP | 1225257 | 7/2002 |
| EP | 1288346 | 8/2002 |
| EP | 1255281 | 11/2002 |
| EP | 1306890 | 5/2003 |
| EP | 1354987 | 10/2003 |
| EP | 1403404 | 3/2004 |
| EP | 1143033 | 9/2004 |
| EP | 1491662 | 12/2004 |
| EP | 1243674 | 6/2005 |
| EP | 1659198 | 5/2006 |
| EP | 1739726 | 1/2007 |
| EP | 1785512 | 5/2007 |
| EP | 1852527 | 11/2007 |
| EP | 1855312 | 11/2007 |
| EP | 1751329 | 1/2008 |
| EP | 1901345 | 3/2008 |
| EP | 1828446 | 3/2010 |
| EP | 1721031 | 11/2010 |
| EP | 2264223 | 12/2010 |
| EP | 2314737 | 4/2011 |
| EP | 1752567 | 9/2011 |
| EP | 2371997 | 10/2011 |
| EP | 2385158 | 11/2011 |
| EP | 2394787 | 12/2011 |
| EP | 2395133 | 12/2011 |
| EP | 2405038 | 1/2012 |
| EP | 2420599 | 2/2012 |
| EP | 2484815 | 8/2012 |
| EP | 2490247 | 8/2012 |
| EP | 2557205 | 2/2013 |
| EP | 1797225 | 3/2013 |
| EP | 2570522 | 3/2013 |
| EP | 2584594 | 4/2013 |
| EP | 1790757 | 8/2013 |
| JP | H05-262599 | 10/1993 |
| JP | H06-316499 | 11/1994 |
| JP | 2003086518 | 3/2003 |
| JP | 2003086816 | 3/2003 |
| JP | 2004099340 | 4/2004 |
| JP | 2004292305 | 10/2004 |

(56) References Cited

FOREIGN PATENT DOCUMENTS

| | | |
|---|---|---|
| JP | 2005051299 | 2/2005 |
| JP | 2005064392 | 3/2005 |
| JP | 2006066722 | 3/2006 |
| JP | 2006120897 | 5/2006 |
| JP | 2007080770 | 3/2007 |
| JP | 2007131504 | 5/2007 |
| JP | 2007230823 | 9/2007 |
| JP | 2008001537 | 1/2008 |
| JP | 2008004888 | 1/2008 |
| JP | 2008053343 | 3/2008 |
| JP | 2008074661 | 4/2008 |
| JP | 2008115034 | 5/2008 |
| JP | 2009182126 | 8/2009 |
| JP | 2010228939 | 10/2010 |
| JP | 2010254520 | 11/2010 |
| JP | 2011020860 | 2/2011 |
| JP | 2011073915 | 4/2011 |
| JP | 2011233932 | 11/2011 |
| JP | 2012028565 | 2/2012 |
| JP | 2012246168 | 12/2012 |
| JP | 2013014469 | 1/2013 |
| KR | 100845946 | 7/2008 |
| WO | WO 9301914 | 2/1993 |
| WO | WO 9713013 | 4/1997 |
| WO | WO 0068474 | 11/2000 |
| WO | WO 0079570 | 12/2000 |
| WO | WO 0218670 | 3/2002 |
| WO | WO 2004014607 | 2/2004 |
| WO | WO 2005111277 | 11/2005 |
| WO | WO 2006031641 | 3/2006 |
| WO | WO 2006108191 | 10/2006 |
| WO | WO 2006135476 | 12/2006 |
| WO | WO 2007035570 | 3/2007 |
| WO | WO 2007058774 | 5/2007 |
| WO | WO 2007148486 | 12/2007 |
| WO | WO 2008033994 | 3/2008 |
| WO | WO 2008039914 | 4/2008 |
| WO | WO 2009003100 | 12/2008 |
| WO | WO 2009075935 | 6/2009 |
| WO | WO 2009080177 | 7/2009 |
| WO | WO 2009120505 | 10/2009 |
| WO | WO 2010041497 | 4/2010 |
| WO | WO 2010111473 | 9/2010 |
| WO | WO 2011034850 | 3/2011 |
| WO | WO 2011083552 | 7/2011 |
| WO | WO 2011126145 | 10/2011 |
| WO | WO 2011/142074 | 11/2011 |
| WO | WO 2011149906 | 12/2011 |
| WO | WO 2012026234 | 3/2012 |
| WO | WO 2012067112 | 5/2012 |
| WO | WO 2012144614 | 10/2012 |
| WO | WO 2013062380 | 5/2013 |

OTHER PUBLICATIONS

Hecht et al. (High-performance multi-wafer SiC epitaxy—First results of using a 10×100 mm reactor, Material Science Form, vols. 645-648 (2010), pp. 89-94).*
Chen, Y., et al. "Studies of the Distribution of Elementary Threading Screw Dislocations in 4H Silicon Carbide Wafer," Materials Science Forum 600-603 (2007): 301-304.
Chung, G., et al. "4H—SiC Epitaxy with Very Smooth Surface and Low Basal Plane Dislocation on 4 Degree Off-Axis Wafer." Materials Science Forum 679-680 (2011): 123-126.
Dmitriev, V., et al. "Growth of SiC and SiC—AlN solid solution by container-free liquid phase epitaxy." Journal of crystal growth 128.1 (1993): 343-348.
Gupta, A., et al. "Status of Large Diameter SiC Single Crystals." Materials Science Forum 717-720 (2012): 3-8.
Gutkin, M., et al. "Micropipe Reactions in Bulk SiC Growth." Silicon Carbide—Materials, Processing and Applications in Electronic Devices (2011): 187-206.
Hecht, C., et al. "High-Performance Multi-Wafer SiC Epitaxy—First Results of Using a 10×100mm Reactor." Materials Science Forum 645-648 (2010): 89-94.
Hull, B., et al., "Development of Large Area (up to 1.5 cm2) 4H—SiC 10 kV Junction Barrier Schottky Rectifiers." Materials Science Forum 600-603 (2008): 931-934.
Ioffe Physico-Technical Institute. "Electronic archive. New Semiconductor Materials. Characteristicsw and Properties, NSM Archive—Silicon Carbide (SiC)," http://www.ioffe.ru/SVA/NSM/Semicond/ accessed Aug. 29, 2013 (1998-2001): 1-72.
Kimoto, T., et al. "Homoepitaxial Growth of 4H—SiC (033¯8) and Nitrogen Doping by Chemical Capor Deposition." Journal of crystal growth 249.1 (2003): 208-215.
Larkin, D., et al. "Site-Competition Epitaxy for Superior Silicon Carbide Electronics," Applied Physics Letters 65.13 (1994): 1659-1661.
Lendenmann, H., et al. "Operation of a 2500V 150A Si-IGBT / SiC Diode Module."0 Materials Science Forum 338-342 (2000): 1423-1426.
Maximenko, S., et al. "Open Core Dislocations and Surface Energy of SiC." Materials Science Forum 527-529 (2006): 439-442.
Mynbaeva, M., et al. "Chemical Vapor Deposition of 4H—SiC Epitaxial Layers on Porous SiC Substrates." Applied Physics Letters 78.1 (2001): 117-119.
Neudeck, P, "Electrical Impact of SiC Structural Crystal Defects on High Electric Field Devices." Materials Science Forum 338-342 (2000): 1161-1166.
Neudeck, P., et al. "Performance Limiting Micropipe Defects in Silicon Carbide Wafers." Electron Device Letters, IEEE 15.2 (1994): 63-65.
Ogunniyi, A., et al. "The Benefits and Current Progress of SiC SGTOs for Pulsed Power Applications." Solid-State Electronics 54.10 (2010): 1232-1237.
Powell, A., et al. "Large Diameter 4H—SiC Substrates for Commercial Power Applications." Materials Science Forum 457-460 (2004): 41-46.
Powell, J., at al. "Process-Induced Morphological Defects in Epitaxial CVD Silicon Carbide." physica status solidi (b) 202.1 (1997): 529-548.
Powell, J., et al. "Sources of Morphological Defects in SiC Epilayers." Transactions Third International High-Temperature Electronics Conference, Sandia National Laboratories 1 (1996): II-3-II-8.
Sanchez, E., et al. "Thermal Decomposition Cavities in Physical Vapor Transport Grown SiC." Materials Science Forum 338.1 (2000): 55-58.
Schulze, N., et al. "Near-Equilibrium Growth of Micropipe-Free 6H—SiC Single Crystals by Physical Vapor Transport," Applied Physics Letters 72.13 (1998): 1632-1634.
Tairov, Y., et al. "General Principles of Growing Large-Size Single Crystals of Various Silicon Carbide Polytypes." Journal of Crystal Growth 52 (1981): 146-150.
Tairov, Y., et al. "Progress in Controlling the Growth of Polytypic Crystals." Progress in Crystal Growth and Characterization 7.1 (1982): 111-162.
Thomas, B., et al. "Properties and Suitability of 4H—SiC Epitaxial Layers Grown at Different CVD Systems for High Voltage Applications." Materials Science Forum 457-460 (2004): 181-184.
Tupitsyn, E., et al. "Controllable 6H—SiC to 4H—SiC Polytype Transformation During PVT Growth," Journal of Crystal Growth 299.1 (2007): 70-76.
Wagner, G., et al. "Vapour Phase Growth of Epitaxial Silicon Carbide Layers." Progress in Crystal Growth and Characterization of Materials 47.2 (2003): 139-165.
Wan, J., et al. "A Comparative Study of Micropipe Decoration and Counting in Conductive and Semi-Insulating Silicon Carbide Wafers," Journal of Electronic Materials. 34.10 (2005): 1342-1348.
Wan, J., et al. "A New Method of Mapping and Counting Micropipes in SiC Wafers," Materials Science Forum 527-529 (2006): 447-450.
Wan, J., et al. "Scaling of Chlorosilane SiC CVD to Multi-Wafer Epitaxy System." Materials Science Forum 556-557 (2007): 145-148.
Wolf, S., et al. Silicon Processing for the VLSI Era, vol. 1—Process Technology. Ch. 1: Silicon: Single-Crystal Growth and Wafering (1986): 1-35.

(56) References Cited

OTHER PUBLICATIONS

Zhou, L., et al, "Chemomechanical Polishing of Silicon Carbice." Journal of the Electrochemical Society 144.6 (1997): L161-L163.

Levinshtein, M., et al. (eds.). Properties of Advanced Semiconductor Materials: GaN, AlN, InN, BN, SiC, SiGe. Ch. 5: Silicon Carbide (SiC) (2001): 93-147.

International Application No. PCT/US2013/059064, International Search Report and Written Opinion, Nov. 18, 2013.

Yashiro, H., et al. "Development of Lapping and Plishing Technologies of 4H—SiC Wafers for Power Device Applications." Materials Science Forum 600-603 (2009): 819-822.

International Application No. PCT/US2013/058996, International Search Report and Written Opinion, Nov. 27, 2013.

International Application No. PCT/US2013/077189, International Search Report and Written Opinion, Mar. 21, 2014.

Chen, W., and M. A. Capano. "Growth and characterization of 4H—SiC epilayers on substrates with different off-cut angles." Journal of applied physics 98.11 (2005): 114907.

International Application No. PCT/US2013/077285, International Search Report and Written Opinion, Apr. 7, 2014.

International Application No. PCT/US2013/077291, International Search Report and Written Opinion, Apr. 4, 2014.

Myers R L et al., "High Epitaxial Growth Rate of 4H-SiC using Horizontal Hot-Wall CVD," *Materials Science Forum Trans Tech Publications Switzerland*, vol. 527-529, 2006, pp. 187-190, XP002728678, ISSN: 0255-5476.

\* cited by examiner

SIC SUBSTRATE WITH SIC EPITAXIAL FILM

CROSS-REFERENCE TO RELATED APPLICATIONS

This application claims the benefit of, and priority to, U.S. Provisional Patent Application No. 61/798,819, filed on Mar. 15, 2013, entitled "SiC SUBSTRATE WITH SiC EPITAXIAL FILM," the entire disclosure of which is hereby incorporated herein by reference.

BACKGROUND

1. Field

This invention relates to fabrication of silicon carbide substrates and, more particularly, to silicon carbide substrates having epitaxial film grown thereupon.

2. Related Art

Silicon carbide, SiC, is a crystalline semiconductor material, recognized by those familiar with materials science, electronics and physics as being advantageous for wide band gap properties and also for extreme hardness, high thermal conductivity and chemical inert properties. These properties make SiC a very attractive semiconductor for fabrication of power semiconductor devices, enabling power density and performance enhancement over devices made from more common materials like silicon.

The most common forms of SiC consist of cubic or hexagonal arrangements of atoms. The stacking of Si and C layers can take on many forms, known as polytypes. The type of silicon carbide crystal is denoted by a number denoting the number of repeat units in the stacking sequence followed by a letter representing the crystalline format. For example the 3C-SiC polytype refers to a repeat unit of 3 and a cubic (C) lattice, while a 4H-SiC polytype refers to repeat unit of 4 and a hexagonal (H) lattice.

The different silicon carbide polytypes have some variations in materials properties, most notably electrical properties. The 4H-SiC polytype has the relatively larger bandgap while the 3C-SiC has a smaller bandgap, with the bandgaps for most other polytypes falling in between. For high performance power device applications when the bandgap is larger, the material is more capable, in theory, to offer relatively higher high power and thermal conductivity performance.

SiC crystals do not occur in nature and as such must be synthesized. Growth of SiC crystals can be executed by sublimation/physical vapor transport or chemical vapor deposition.

Once SiC crystals are produced, each crystal must be cut and fabricated into wafers using planar fabrication methods to fabricate semiconductor devices. As many semiconductor crystals (e.g., silicon, gallium arsenide) have been successfully developed and commercialized into wafer products, the methods to fabricate wafers from bulk crystals are known. A review of the common approaches to, and requirements for wafer fabrication and standard methods of characterization can be found in Wolf and Tauber, Silicon Processing for the VLSI Era, Vol. 1—Process Technology, Chapter 1 (Lattice Press—1986). Due to its hardness, fabrication of SiC into wafer substrates presents unique challenges compared to processing other common semiconductor crystals like silicon or gallium arsenide. Modifications must be made to the machines, and the choices of effective abrasives are beyond commonly used materials. The modifications made to common wafer fabrication techniques in order to accommodate SiC are often kept as proprietary information. However, it has been reported that substantial subsurface damage is observable on mirror polished SiC wafers, and this can be reduced or removed by using chemical enhanced mechanical polishing methods similar to that used in the silicon industry (Zhou, L., et al., Chemomechanical Polishing of Silicon Carbide, J. Electrochem. Soc., Vol. 144, no. 6, June 1997, pp. L161-L163).

In order to build semiconductor devices on SiC wafers, additional crystalline SiC films must be deposited on the wafers, so as to create the device active regions with the required conductivity value and conductor type. This is typically done using chemical vapor deposition (CVD) methods. Techniques for growth of SiC by CVD epitaxy have been published from groups in Russia, Japan and the United States since the 1970's. The most common chemistry for growth of SiC by CVD is a mixture of a silicon containing source gas (e.g., monosilanes or chlorosilanes) and a carbon containing source gas (e.g., a hydrocarbon gas). A key element to growth of low defect epitaxial layers is that the substrate surface is tilted away from the crystal axis of symmetry, to allow the chemical atoms to attach to the surface in the stacking order established by the substrate crystal. When the tilt is not adequate, the CVD process will produce three dimensional defects on the surface, and such defects will result non-operational semiconductor devices. Surface imperfections, such as cracks, subsurface damage, pits, particles, scratches or contamination will interrupt the replication of the wafer's crystal structure by the CVD process (see, for example, Powell and Larkin, Phys. Stat. Sol. (b) 202, 529 (1997)). Therefore, it is important that the polishing and cleaning processes used to fabricate the wafer minimize surface imperfections. In the presence of these surface imperfections several defects can be generated in the epitaxial films, including basal plane dislocations and cubic SiC inclusions (see for example, Powell, et. al. Transactions Third International High-Temperature Electronics Conference, Volume 1, pp. 11-3 -11-8, Sandia National Laboratories, Albuquerque, N. Mex. USA, 9-14 June 1996).

The methods of SiC epitaxy have been reviewed by G. Wagner, D. Schulz, and D. Siche in Progress in Crystal Growth and Characterization of Materials, 47 (2003) p. 139-165. Wagner discusses that SiC epitaxy can achieve favorable results if performed in a hot wall reactor, where all the surfaces of the reaction cell that are exposed to gases, including the susceptor that holds the SiC substrate, are actively heated. This is in contrast to a cold wall reactor where only the susceptor supporting the SiC substrate is actively heated, while the other surfaces are actively cooled or designed not to heat. Today there is also a so called warm wall CVD system, which is an intermediate of the hot and cold wall design, where the susceptor of the reaction cell supporting the SiC substrate is actively heated, and top and side surfaces of the cell adjacent to this heated surface are allowed to be indirectly heated. Warm wall CVD systems capable of depositing SiC epitaxy on several wafers simultaneously have emerged for commercial applications. Such systems have been described by Burk, Jr. (U.S. Pat. No. 5,954,881), Jurgensen, et. al., (WO 2002018670), and Hecht, et. al., (Materials Science Forum Vols. 645-648 (2010) pp. 89-94).

Defects in SiC are known to limit or destroy operation of semiconductor devices formed over the defects. Neudeck and Powell reported that hollow core screw dislocations (micropipes) severely limited voltage blocking performance in SiC diodes (P. G. Neudeck and J. A. Powell, IEEE Electron Device Letters, vol. 15, no. 2, pp. 63-65, (1994)). Neudeck reviewed the impact of crystal (wafer) and epitaxy originated defects on power devices in 1994, highlighting limitations of power device function due to screw dislocations and morphological epitaxy defects (Neudeck, Mat. Sci. Forum, Vols. 338-342, pp. 1161-1166 (2000)). Hull reported shift to lower values in the distribution of high voltage diode reverse bias leakage current when the diodes were fabricated on substrates having lower screw dislocation density (Hull, et. al., Mat. Sci. forum, Vol. 600-603, p. 931-934 (2009)). Lendenmann reported forward voltage degradation in bipolar diodes was linked to basal plane dislocations in the epilayer that originate from basal plane dislocations in the substrate (Lendenmann et. al., Mat. Sci. Forum, Vols. 338-342, pp. 1161-1166 (2000)).

3. Problem Statement

Advances in SiC substrate and epitaxy are required in order to reduce the concentration of defects that impact device operation and fabrication yields. Currently, defects formed on the surface of the substrate during SiC CVD epitaxy are the most influential defect impacting operation and yields of semiconductor devices on SiC substrates. In particular, SiC power devices which are required to handle large current (>50 A) with low on resistance are made using relatively large die sizes, greater than 7 mm per side. To achieve good manufacturing yield of these devices, methods to further reduce CVD epitaxy originated defects need to be developed. Solutions of these problems must also be capable of producing repeatable and consistent deposition of films that are smooth, uniform in thickness and electrical properties so that these parameters are still consistent with high device fabrication yields.

In multi-wafer, warm wall SiC CVD systems, reactant gas is introduced to a graphite reaction zone in the center of the system, the gas flow fans out in the radial direction and parallel to the substrate surface, and is finally evacuated at the periphery of the chamber. The floor of the reaction zone, or susceptor, contains the substrates and is actively heated, making it the hottest point in the reaction zone. Heating of the susceptor may be done using RF induction techniques or by resistive heaters. The adjacent surfaces are indirectly heated by the susceptor at the bottom of the chamber, and are at lower temperatures than the temperature target of the susceptor. Due to the control temperatures required for SiC CVD epitaxy, the reaction cell is constructed from graphite. Prior to its use, the parts of the reaction zone are often coated with pyrocarbon or tantalum carbide films which act as barriers to the out diffusion of impurities from the graphite. During CVD, ancillary deposits of SiC rapidly grow on the adjacent surfaces at a rate faster than the susceptor/substrate surface. Often, a mask, such as plates of polycrystalline SiC, can be laid over the uncovered regions of the susceptor to mask or protect areas of the susceptor from ancillary deposits. When these ancillary deposits reach a critical thickness, they will shed particles onto the substrates, resulting in defects in the epitaxial film that will impair operation of semiconductor devices. In addition, the formation of ancillary deposits consumes process gas reactant which can lead to run-to-run variations in film properties, film surface morphology, and particularly electrical properties.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various disclosed embodiments provide control of CVD SiC epitaxy originated defects, surface roughness, epitaxy film thickness, epitaxy film doping and run-to-run consistency, using a multi-wafer CVD system.

According to one aspect, a method is described providing a strategy of gas flow and temperature control to ensure optimal distribution of gaseous chemical reactants in the reaction zone.

According to another embodiment, a method is described providing a pretreatment of an unused reaction cell to coat it with a layer of SiC in such a way that the future ancillary deposits have good adhesion to the original reaction cell surfaces and avoid growth morphology that can result in separation of the deposits from the walls and particles falling on the substrates. This process would be repeated when a new or reconditioned reaction cell is placed into the CVD system.

In one aspect, provided herein is a method of manufacturing a 4H-SiC epiwafer comprising an epitaxial SiC film on a single-crystal 4H-SiC substrate, the method comprising: loading the single-crystal 4H-SiC substrate onto a susceptor in a reaction cell of a warm wall CVD system; heating the system by controlling a temperature of the susceptor in the reaction cell to a range from 1500° C. to 1620° C.; and executing a manufacturing run to produce the 4H-SiC epiwafer, the manufacturing run comprising supplying a gas flow parallel to a surface of the single-crystal 4H-SiC substrate, such that a total gas velocity is in a range from 120 to 250 cm/sec and controlling a pressure inside the reaction cell to a range from 100 to 150 mbar, wherein the gas flow comprises a mixture of hydrogen gas, silicon gas, and carbon gas, in order to produce the epitaxial SiC film on the single-crystal 4H-SiC substrate.

In one embodiment of this aspect, the method further comprises establishing a temperature gradient from a surface of the epiwafer to a ceiling of the reaction cell in a range from 25° C./cm to 80° C./cm.

In another embodiment of this aspect, the method further comprises: measuring performance metrics of the 4H-SiC epiwafer; and removing the used reaction cell when the measured performance metrics of the 4H-SiC epiwafer fall below acceptable threshold limits.

In another embodiment of this aspect, the step of loading the single-crystal 4H-SiC substrate onto the susceptor in the reaction cell of the warm wall CVD system is preceded by pre-treating the reaction cell, the pre-treating comprising: loading a sacrificial substrate onto the susceptor in the reaction cell; sealing and evacuating the reaction cell; purging the reaction cell using inert and hydrogen gases; baking the reaction cell at a temperature in the range 1400° C. to 1700° C. while flowing hydrogen gas mixed with 1% to 10% hydrocarbon gas; performing a CVD deposition process so as to deposit an SiC film on the sidewall and ceiling of the reaction cell; and removing the sacrificial substrate from the reaction cell.

In another embodiment of this aspect, the step of executing a manufacturing run to produce the 4H-SiC epiwafer comprises: placing the single-crystal 4H-SiC substrate on the susceptor in the reaction cell of the warm wall CVD system; evacuating the reaction cell and then purging the reaction cell with argon; terminating the argon flow and initiating hydrogen gas flow into the reaction cell; establishing the temperature gradient from the surface of the epiwafer to the ceiling in the range from 25° C./cm to 80° C./cm; flowing parallel to the surface of the epiwafer a gas mixture of hydrogen, silicon and carbon gases, at a total gas velocity of 120 to 250 cm/sec; maintaining the process conditions to achieve a total deposit of from 3 to 120 μm of film on the single-crystal 4H-SiC substrate in order to produce the epitaxial SiC film on the single-crystal 4H-SiC substrate; cooling the system to a temperature less than 300° C.; and removing the single-crystal 4H-SiC substrate.

In another embodiment of this aspect, the method further comprises testing the performance of the single-crystal 4H-SiC substrate.

In another embodiment of this aspect, in the step of maintaining the process conditions to achieve the total deposit of from 3 to 120 µm of film on the single-crystal 4H-SiC substrate in order to produce the epitaxial SiC film on the single-crystal 4H-SiC substrate, the gas flow further comprises doping gas.

In another embodiment of this aspect, the method further comprises flowing an etching gas into the reaction cell to etch the single-crystal 4H-SiC substrate prior to the step of maintaining the process conditions to achieve the total deposit of from 3 to 120 µm of film on the single-crystal 4H-SiC substrate in order to produce the epitaxial SiC film on the single-crystal 4H-SiC substrate.

In another embodiment of this aspect, the etching gas comprises a halogen gas and hydrogen.

In another embodiment of this aspect, the single-crystal 4H-SiC substrate comprises a polished 4H-SiC wafer with a diameter ranging from 100 to 200 mm and having a nitrogen concentration of at least $1 \times 10^{18}/cm^3$.

In another embodiment of this aspect, the epitaxial SiC film is deposited on an exposed silicon surface of the single-crystal 4H-SiC substrate.

In another embodiment of this aspect, the epitaxial SiC film is deposited on an exposed carbon surface of the single-crystal 4H-SiC substrate.

In another embodiment of this aspect, in the step of loading the single-crystal 4H-SiC substrate onto a susceptor in a reaction cell of a warm wall CVD system, a plurality of five to twelve single-crystal 4H-SiC substrates are placed in the reaction cell.

In another embodiment of this aspect, when in the step of loading the single-crystal 4H-SiC substrate onto a susceptor in a reaction cell of a warm wall CVD system, a plurality of single-crystal 4H-SiC substrates are placed on the susceptor in the reaction cell of the warm wall CVD system.

In another embodiment of this aspect, the reaction cell comprises a graphite reaction cell, and further comprises coating the reaction cell's graphite components with pyrocarbon or tantalum carbide films prior to assembling the cell for use in CVD epitaxy.

In another embodiment of this aspect, a single-crystal 4H-SiC substrate with epitaxial SiC film is produced by the method, and a within wafer total thickness variation of the SiC epitaxial film is from 2 to 12%, inclusive; a within wafer dopant concentration of the epitaxial SiC film is from 5 to 40%, inclusive; a top surface of the epitaxial SiC film has an RMS roughness value of 0.2 to 1.2 nm; inclusive; and a density of surface defects on the epitaxial SiC film is from 0.25 to 2.0/cm², inclusive.

In another aspect, provided herein is a method of forming a 4H-SiC epiwafer comprising an epitaxial SiC film on a single-crystal 4H-SiC substrate positioned on a susceptor in a warm wall CVD system, the warm wall CVD system having a reaction cell comprising the susceptor positioned at a bottom, a sidewall, and a ceiling, wherein the susceptor is actively heated, and the ceiling and sidewall are not actively heated, but are allowed to be indirectly heated by the susceptor, the method comprising: inserting an unused reaction cell assembly into a CVD epitaxy system; a first process for treatment of the reaction cell preparation; and a second process for epitaxial film growth; wherein: the first process for treatment of the reaction cell preparation comprises the steps: loading the susceptor with a sacrificial substrate; sealing and evacuating the reaction cell; purging the reaction cell using argon and hydrogen gases; baking the reaction cell in a mixture of hydrogen and hydrocarbon gas; and performing a CVD deposition process so as to deposit an SiC film on the sidewall and ceiling of the reaction cell; and the second process for epitaxial film growth comprises the steps: allowing the reaction cell to cool; placing the single-crystal 4H-SiC substrate on the susceptor; evacuating and then purging the reaction cell with argon gas; heating the susceptor to a temperature of 1200° C. to 1400° C., inclusive; terminating the argon flow and initiating hydrogen gas flow into the reaction cell; flowing parallel to the surface of the wafers a gas mixture of hydrogen, silicon and carbon gases, at a total gas velocity of 120 to 250 cm/sec; maintaining a temperature of the susceptor at 1500° C. to 1620° C.; and controlling a pressure inside the reaction cell at from 100 to 150 mbar, inclusive, to achieve a total deposit of 3 to 120 µm of film on the substrate.

In one embodiment of this aspect, the step of baking the unused reaction cell comprises heating the reaction cell to a temperature of from 1400° C. to 1700° C. and maintaining the temperature for from 4 to 24 hours.

In another embodiment of this aspect, a ratio of volumetric flow of carbon to silicon gases is less than 1, but greater than 0.05.

In another embodiment of this aspect, the temperature of the susceptor, the total gas velocity, and a throttle setting of the reaction cell are controlled so as to maintain a temperature gradient from the substrate to the ceiling in a range from 25° C./cm to 80° C./cm.

In another embodiment of this aspect, the total gas velocity is maintained at 120 to 160 cm/sec, inclusive.

In another embodiment of this aspect, the total gas velocity is maintained at 175 to 250 cm/sec, inclusive.

In another embodiment of this aspect, the step of maintaining a temperature of the susceptor at 1500° C. to 1620° C. of the second process further comprises establishing a temperature gradient from the 4H-SiC substrate to the ceiling of 25° C./cm to 80° C./cm.

In another embodiment of this aspect, a plurality of single-crystal 4H-SiC substrates are placed in the reaction cell.

In yet another aspect, provided herein is a 4H-SiC substrate with an epitaxial SiC film deposited on one surface thereof; wherein, a within wafer total epitaxy film thickness varies from 2 to 12%, inclusive; a within wafer dopant concentration of each epitaxy layer varies from 5 to 40%, inclusive; a top surface of the epitaxy film has an RMS roughness value in a range from 0.2 to 1.2 nm, inclusive; and a density of surface defects on the film is from 0.25 to 2.0/cm², inclusive.

In still another aspect, provided herein is a method of forming an epitaxial SiC film on a single-crystal 4H-SiC substrate in a warm wall CVD system, the warm wall CVD system having a reaction cell comprising a susceptor positioned at a bottom, a sidewall, and a ceiling, the method comprising: positioning the single-crystal 4H-SiC substrate on the susceptor; evacuating the reaction cell and then purging the reaction cell with argon; actively heating the susceptor to a temperature of 1200° C. to 1400° C. and allowing the ceiling and sidewall to be indirectly heated by the susceptor, thereby creating a decreasing temperature gradient from the susceptor to the ceiling; terminating the argon flow and initiating hydrogen gas flow into the reaction cell; establishing the temperature gradient from the wafer surface to the ceiling in a range from 25° C./cm to 80° C./cm via heating the system by controlling the temperature of the susceptor to a range from 1500° C. to 1620° C.; supplying a gas flow parallel to the surface of the substrate, such that total gas velocity is in a range from 120 to 250 cm/sec and controlling the pressure inside the reaction cell to a range from 100 to 150 mbar, and wherein the gas flow comprises a mixture of hydrogen gas, silicon gas, and carbon gas; maintaining the process conditions to achieve a total deposit of from 3 to 120 μm of film on the substrate; and cooling the system to an ambient temperature.

In one embodiment of this aspect, the reaction cell comprises a graphite reaction cell, and further comprises coating the reaction cell's graphite components with pyrocarbon or tantalum carbide films prior to assembling the cell for use in CVD epitaxy.

In another embodiment of this aspect, the reaction cell comprises a graphite reaction cell, and further comprises coating the reaction cell's interior with an SiC film prior to the step of positioning the single-crystal 4H-SiC substrate on the susceptor.

In another embodiment of this aspect, the reaction cell's interior is coated with the SiC layer by the steps: evacuating the reaction cell and then purging the reaction cell; flowing a gas mixture of Si and C precursors where a gas volumetric flow ratio of carbon to silicon precursors, taken as a ratio of (number of C atoms in precursor molecule)×(carbon volume flow)/(silicon volume flow), is less than one but greater than 0.05; and heating the reaction cell to form SiC deposits on the reaction cell's interior.

In another embodiment of this aspect, the gas mixture further comprises hydrogen.

In another embodiment of this aspect, the method further comprises a step of heating the reaction cell to a temperature from 1400° C. to 1700° C. and baking the reaction cell for from 4 to 24 hours prior to the step of evacuating the reaction cell and then purging the reaction cell with argon.

In another embodiment of this aspect, the step of actively heating the susceptor to the temperature of 1200° C. to 1400° C. and allowing the ceiling and sidewall to be indirectly heated by the susceptor, thereby creating the decreasing temperature gradient from the susceptor to the ceiling is performed until the SiC deposits reach a thickness that equates to a thickness of 5 to 10 μm as deposited on the SiC wafers.

In another embodiment of this aspect, at the step of supplying the gas flow parallel to the surface of the substrate, such that total gas velocity is in the range from 120 to 250 cm/sec and controlling the pressure inside the reaction cell to the range from 100 to 150 mbar, and wherein the gas flow comprises the mixture of hydrogen gas, silicon gas, and carbon gas, a flow of donor or acceptor dopant gas is supplied.

In another embodiment of this aspect, a plurality of single-crystal 4H-SiC substrates are placed in the reaction cell.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

It should be understood that this invention is not limited to the particular methodology, protocols, etc., described herein and as such may vary. The terminology used herein is for the purpose of describing particular embodiments only, and is not intended to limit the scope of the present invention, which is defined solely by the claims.

As used herein and in the claims, the singular forms include the plural reference and vice versa unless the context clearly indicates otherwise. Other than in the operating examples, or where otherwise indicated, all numbers expressing quantities used herein should be understood as modified in all instances by the term "about."

All publications identified are expressly incorporated herein by reference for the purpose of describing and disclosing, for example, the methodologies described in such publications that might be used in connection with the present invention. These publications are provided solely for their disclosure prior to the filing date of the present application. Nothing in this regard should be construed as an admission that the inventors are not entitled to antedate such disclosure by virtue of prior invention or for any other reason. All statements as to the date or representation as to the contents of these documents is based on the information available to the applicants and does not constitute any admission as to the correctness of the dates or contents of these documents.

Unless defined otherwise, all technical and scientific terms used herein have the same meaning as those commonly understood to one of ordinary skill in the art to which this invention pertains. Although any known methods, devices, and materials may be used in the practice or testing of the invention, the methods, devices, and materials in this regard are described herein.

The following examples illustrate some embodiments and aspects of the invention. It will be apparent to those skilled in the relevant art that various modifications, additions, substitutions, and the like can be performed without altering the spirit or scope of the invention, and such modifications and variations are encompassed within the scope of the invention as defined in the claims which follow. The following examples do not in any way limit the invention.

The following description provides examples for performing SiC epitaxial growth, while minimizing defects. The methods are implemented in a warm wall CVD reactor.

The optimal process parameters (temperature, pressure, gas flow) for operation of the CVD growth process were first determined. Using these process parameters, the "characteristic" parameters for the CVD process and reactor configuration were determined using finite element models. From this modeling work, it was determined that the important characteristic parameters for warm wall SiC growth are gas velocity and the temperature gradient between the wafer growth surface and the top of the reaction zone.

Figure 1:
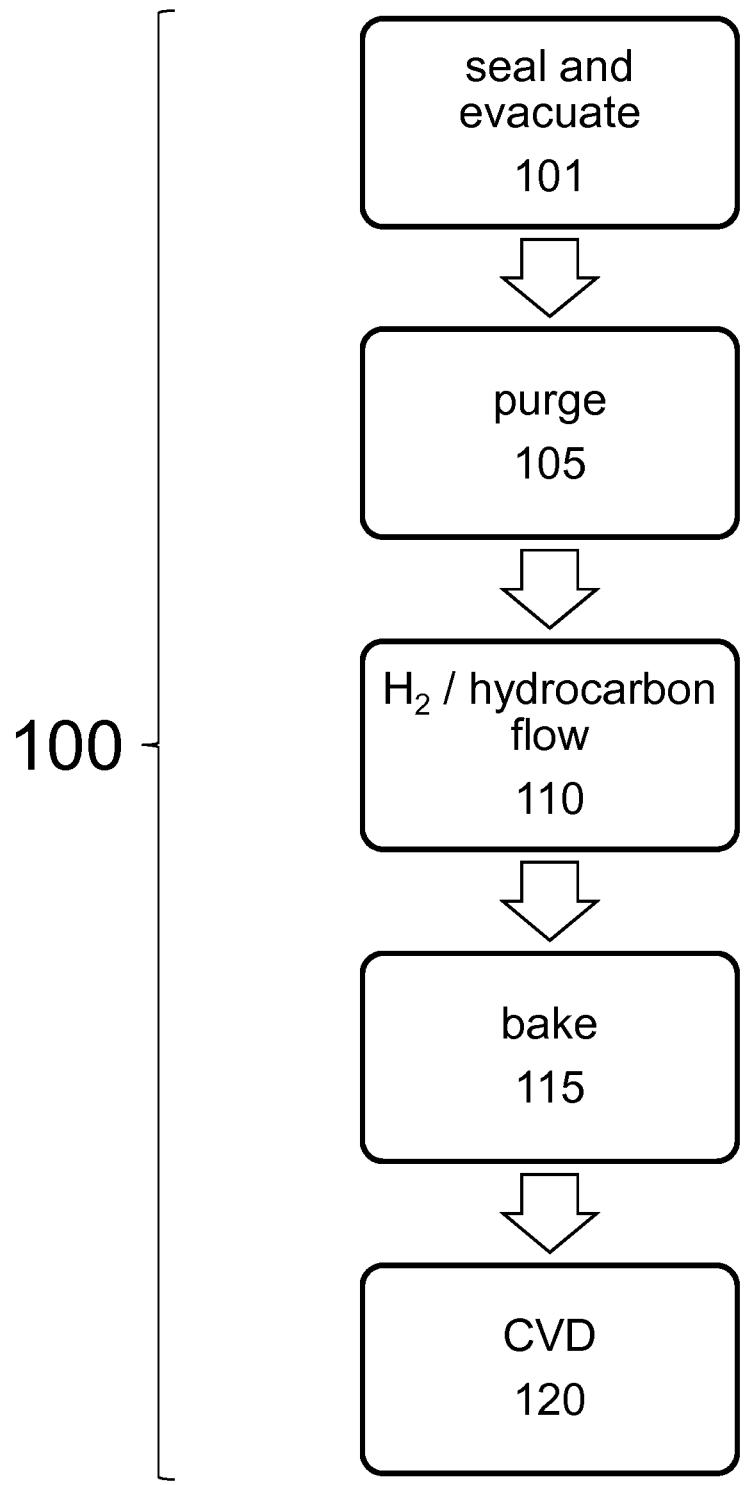
FIG. 1 is a flow chart illustrating a pre-treat process according to one embodiment.

FIG. 1 is a flow chart illustrating a pre-epitaxy, conditioning treatment process 100 for a new or reconditioned reaction cell assembly according to one embodiment. The conditioning treatment process is a two-step method which consists of heating the reaction cell and then depositing an SiC coating on the reaction cell surfaces. The method was implemented in a multi-wafer, warm wall CVD system with a consumable reaction cell assembled from graphite parts which are coated with CVD coatings of either pyrocarbon or tantalum carbide. Plates or masks of polycrystalline SiC may be used to cover open areas of the susceptor and "sacrificial" wafers are placed in the wafer pockets, such wafers are not products of the process and only used to protect the pockets from deposition. The regions of the susceptor that do not hold wafers are, in some embodiments, covered by masks or plates of polycrystalline SiC. In this manner, the susceptor is totally protected and the ancillary deposits are formed on the plates and the sacrificial wafers and not on the susceptor surface. These plates can be periodically removed and the SiC deposits machined away by grinding. Then, the plates can be reused. This process can prolong the life of the susceptor. The masks/plates are used 100% of the time the machine is run.

Following the process of FIG. 1, first the system is sealed, evacuated (step 101) and purged (step 105) with an inert gas such as argon, and/or a gas mixture containing an inert gas and hydrogen to eliminate atmospheric gas impurities. Next, in step 110 a gas flow of $H_2$, and optionally an additional flow of hydrocarbon gas, is established and the pressure controlled using a throttle valve to a value in a range of from 100 to 900 mbar, inclusive. The fraction of hydrocarbon gas is typically in the range 0 to 10% by volume. The system is then heated to a temperature from 1400° C. to 1700° C. and baked for from 4 to 24 hours (step 115). Once the system has been baked, a base coating of SiC is then applied to the reaction cell surfaces using a CVD process with silicon and carbon precursor gases, and with sacrificial substrates loaded in the susceptor pockets to prevent deposition in the pocket. This chamber-wall coating facilitates good adhesion of subsequent deposits on the surfaces not covered by the wafers (step 120).

Gaseous precursors for Si and C are added to the $H_2$ gas flow to form a SiC film on the reaction cell's sidewall and ceiling. The flow of Si and C precursors are set to conditions where the gas volumetric flow ratio of carbon to silicon precursors, taken as the ratio of (number of C atoms in precursor molecule)×(carbon volume flow)/(silicon volume flow), is less than one but greater than 0.05. The pressure is set into a range of 100 to 200 mbar. The process conditions are held in the reaction zone such that a film coats the inside surfaces of the reaction cell, this film equates to a thickness of 5 to 10 μm as deposited on the SiC wafers. This level of wafer deposit is sufficient to form a SiC coating with good adhesion to the surfaces in the reaction zone and the pretreatment process is completed by terminating the flow of Si and C precursors and cooling the system to ambient conditions under $H_2$ flow. The sacrificial substrates are removed from the system, and the system is ready to be used to produce SiC epitaxy wafer products. Typically the system is loaded with polished hexagonal, single-crystal SiC substrates of the 4H-SiC polytype. As the epitaxy process is repeated, coatings form on the walls of the cell, and these coatings will slowly deteriorate the cell material, change the temperatures in the reaction cell and also flake off and fall onto the SiC substrates. When this reaction cell deteriorates to the point where the quality of epitaxial wafers produced using the cell is below an acceptable threshold limit, a new or reconditioned reaction cell assembly is loaded into the CVD system and the pre-epitaxy treatment process described above is executed again.

Figure 2:
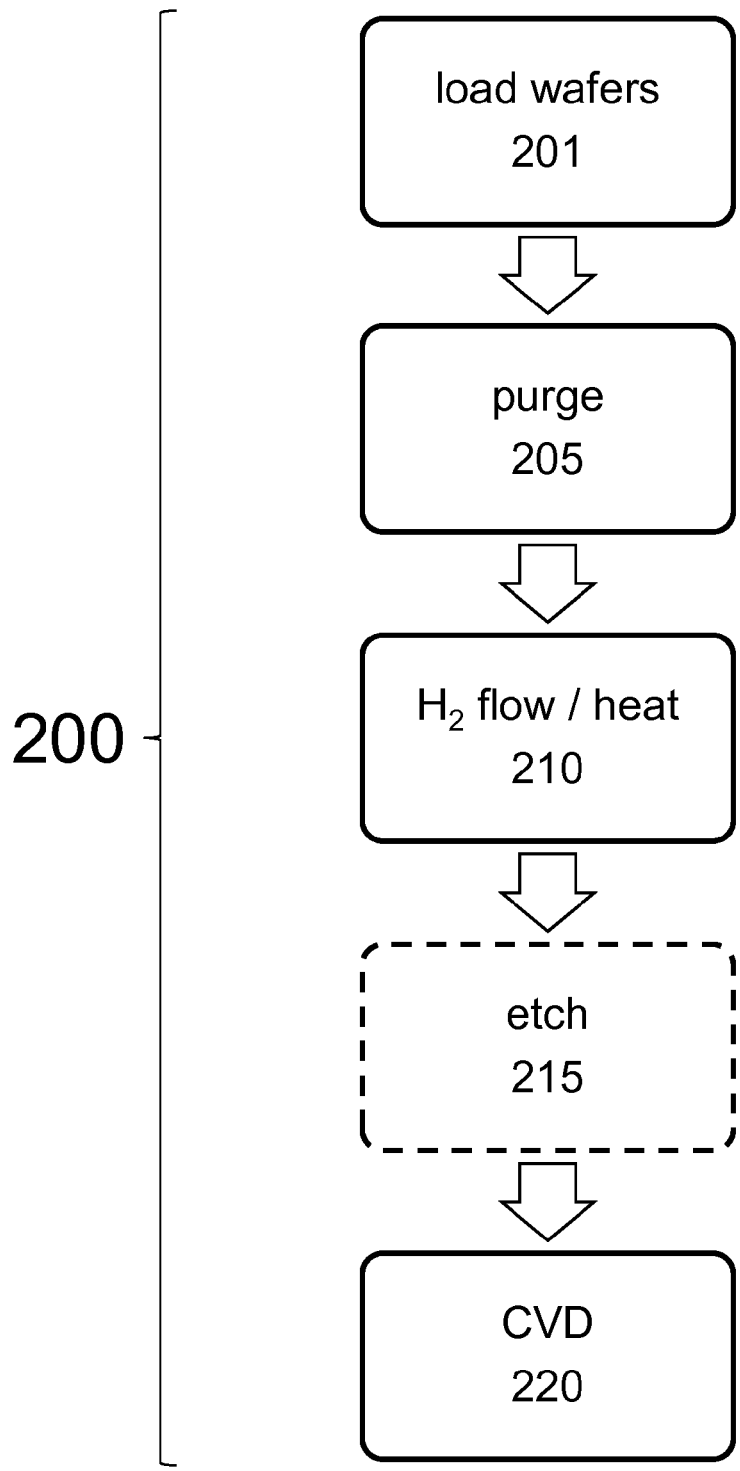
FIG. 2 is a flow chart illustrating an embodiment for CVD epitaxial growth of film on the SiC substrates.

FIG. 2 is a flow chart illustrating an embodiment for CVD epitaxial growth of film on the SiC substrates 200. In step 201 the CVD system is loaded with single-crystal, hexagonal SiC wafers to fill the susceptor wafer pockets. The masks used during the conditioning process of FIG. 1 may remain, or fresh masks may be placed on the susceptor to protect any exposed surface of the susceptor. The system is evacuated, and then a flow of argon and/or hydrogen is established parallel to the wafer surface in step 205 to purge the reaction cell. At step 210 the system is heated to 1200° C. to 1400° C., and then the argon gas is replaced with hydrogen gas. Next, at step 215 the temperature is set to a range of 1500° C. to 1620° C. and $H_2$ gas flow is adjusted to achieve a specific velocity and gradient conditions for epitaxial growth as follows. A CVD system can be used to perform epitaxial growth 220. Here, the term "epitaxial growth" and the like is understood to include, for example, executing a manufacturing run to produce an SiC coated epiwafer, which is to be distinguished from pre-epitaxy steps.

For the process to deposit crystalline SiC films on the crystalline SiC substrates, it is found that the conditions must be established to achieve the proper temperature distribution and gas velocity that will result in the optimal distribution of gas reactants to result in optimal control of particle/surface defects, film thickness, doping and film surface morphology. In one example, since only the bottom of the reaction cell is actively heated, the hydrogen gas flow value will impact the temperature of the other surfaces of the reaction cell. This effect is a result of the hydrogen flow value and the relatively large thermal conductivity of hydrogen, which will act to cool surfaces in contact with the gas flow. It is found that a gas velocity set in the range from 100 to 250 cm/sec, inclusive, with actual value depending on the gas flow, outer diameter of the reaction zone, and the area of the exit of the reaction zone, will deliver optimum SiC film properties. For a warm wall multi-wafer CVD system configured as in the examples of Burk or Hecht, if the system is designed to process a configuration of simultaneous processing of five substrates, each having a diameter of 76 mm, the optimum gas velocity is in the range of 120 to 250 cm/sec, and, in some embodiments, 120 to 160 cm/sec. If the system is made larger for simultaneous processing of ten to twelve substrates with a diameter ranging from 100 to 200 mm, and, in some embodiments, with a diameter of 100 mm or six substrates with a diameter of 150 mm, the optimum gas velocity is in the range of 175 to 250 cm/sec. When this gas flow condition is set, it is found that it will correspond to a vertical temperature gradient, in the location between the wafer surface and the top of the reaction cell above the wafer in the range of 25° C./cm to 80° C./cm, with the top of the reaction cell lower in temperature than the wafer surface. This corresponds to a range of process control temperatures of 1500° C. to 1620° C. and hydrogen gas flow in the range 65 to 130 slpm (Standard Liters Per Minute). It is this combination of $H_2$ flow and gas velocity at a given process temperature that provide conditions that are optimum for controlling SiC film formation. Since the composition of the gases used in SiC epitaxy is greater than 99% hydrogen, the gas flow of hydrogen primarily sets the velocity and temperature gradient conditions. When reactive gasses are added and a CVD process is executed, the SiC films formed under these conditions have optimal epitaxy film properties and free of particle formation that result from ancillary deposits.

Using the process conditions of this method, it is found that the preferred temperature gradients are significantly smaller than that reported for SiC growth in hot wall and cold wall reactors (B. Thomas et. al., Materials Science Forum, 457-460, 181, 2004). The properties of the epitaxial films produced by the optimized method of this work are improvements over the results reported in the paper by Thomas, et al.

Referring back to FIG. 2, after the preconditioning process of FIG. 1 is completed, the process of FIG. 2 is initiated where in step 201 the CVD system can be opened and reloaded with new SiC substrates for growth to targeted film parameters. Typically these substrates are polished and cleaned 4H-SiC substrates tilted away from the c-axis to the <11-20>direction between 2 to 8 degrees. The substrates used are typically doped with nitrogen to a concentration larger than $1\times10^{18}/cm^3$. The substrates can be used in such a way that the epitaxial layer is formed on either the silicon face (0001 direction) or the carbon face (000-1 direction). Once the system is loaded with polished substrates, in step 205 the reaction cell is evacuated, and then a flow of argon is established parallel to the wafer surface. The system is heated to a temperature in the range 1200° C. to 1400° C., and then the argon gas is replaced with hydrogen gas (step 210). Next, the temperature is set to a range of from 1500° C. to 1620° C. and $H_2$ gas flow is adjusted to achieve the velocity and gradient conditions described above for the CVD growth (step 201). Prior to the growth of the SiC epitaxy layer the substrates can be exposed to a gas mixture which lightly etches the surface to eliminate any traces of surface damage or contamination from the substrate polishing process (optional step 215). At the time for film growth, gaseous precursors for Si and C are added to the total gas flow to form a SiC film. The concentration of reactive Si, C and impurity gases is typically less than 1.5% of the total flow. During formation of the epitaxial film, nitrogen, phosphine, diborane or trimethylaluminum can be added to the gas flow to establish appropriate levels of donor or acceptor impurities in the film, which will establish the desired resistivity. Films are typically deposited at pressure of from 100 to 150 mbar, inclusive. Film thickness can typically range from 5 to 150 µm, inclusive, and, in some embodiments, 3 to 120 µm. Typical donor/acceptor atom concentrations can range from $1\times10^{14}$ to $2\times10^{19}/cm^3$, inclusive.

Film thickness is typically tested using infrared spectroscopy, while donor or acceptor concentration is measured by capacitance voltage testing. Typically the wafer is tested with a map comprised of a symmetric radius-theta pattern where measurements are made at 2 to 3 radius values to a value as large as the wafer radius minus 3 mm, and repeated 4 to 8 times over rotation values of 360/(number of repeat points). For example, a point repeated at a given radius is measured at theta values of 0, 90, 180 and 270 degrees. When the proper gas velocity and temperature gradient are established, it is found that the films will exhibit within wafer thickness described by the relation (Max value–min value)/min value ranging from 2 to 12%, inclusive, and the films will exhibit within wafer dopant concentration variations described by the relation (Max value-min value)/min value from 5 to 40%, inclusive. It is found that larger values of the ranges reported above will be observed when the largest radius measurement point is taken within 8 mm or less of the edge of the substrate.

Under the optimum conditions of gas velocity and temperature gradient it is found that the surfaces of the epitaxial film will be smooth and surface defects will be minimized. When the roughness of a film is measured by atomic force microscopy at scan size of 20×20 µm or less, this will result in an RMS roughness value from 0.2 to 1.2 nm, and, in some embodiments, 0.2 to 1.0 nm, inclusive. At this level of roughness the wafers appear generally free of step bunching. The surface defects are measured using laser light scattering spectrometry. The entire wafer is scanned to within 1 to 3 mm of the wafer edge, and then the scanned area is segregated into 2×2 mm sites. The total surface defects are determined by counting the sites with and without defects and then calculating the ratio of the defect sites to the defect free sites to determine the fraction of sites free of defects. Then using a Poisson distribution the defect density is calculated from the defect free fraction and the site area. The resulting density of defects ranges from 0.25 to 2.0 defects/$cm^2$.

EXAMPLE 1

A warm wall CVD system capable of processing 5 pcs of 76 mm diameter substrates was used for epitaxial growth.

The substrates used were 4H-SiC polytype, tilted 4 degrees away from the c-axis to the <11-20>direction. The substrates had resistivity in the range 0.015 to 0.030 ohm-cm.

A new set of graphite consumables was loaded, baked and coated with a SiC layer as described. The substrates were loaded and processed. The process details and the results measured on a wafer from the process are:
Run ID/Wafer ID: 1241_AV1006-09
Growth temperature: 1585° C.
Pressure: 124 mbar
Total Hydrogen flow: 72.4 slpm
Film Thickness: 5.53 µm, within wafer range 8.1%
Growth temperature: 1585° C.
Pressure: 124 mbar
Total $H_2$ flow: 72.4 slpm
Doping: $5.5\times10^{15}/cm^3$, within wafer range 15%.
Defect density: 0.4 $cm^{-2}$
RMS roughness 0.61 nm

EXAMPLE 2

A warm wall CVD system capable of processing 10 pcs of 100 mm diameter substrates was used for epitaxial growth.

The substrates used were 4H-SiC polytype, tilted 4 degrees to the <11-20>direction. The substrates had resistivity in the range 0.015 to 0.030 ohm-cm.

Figure 3:
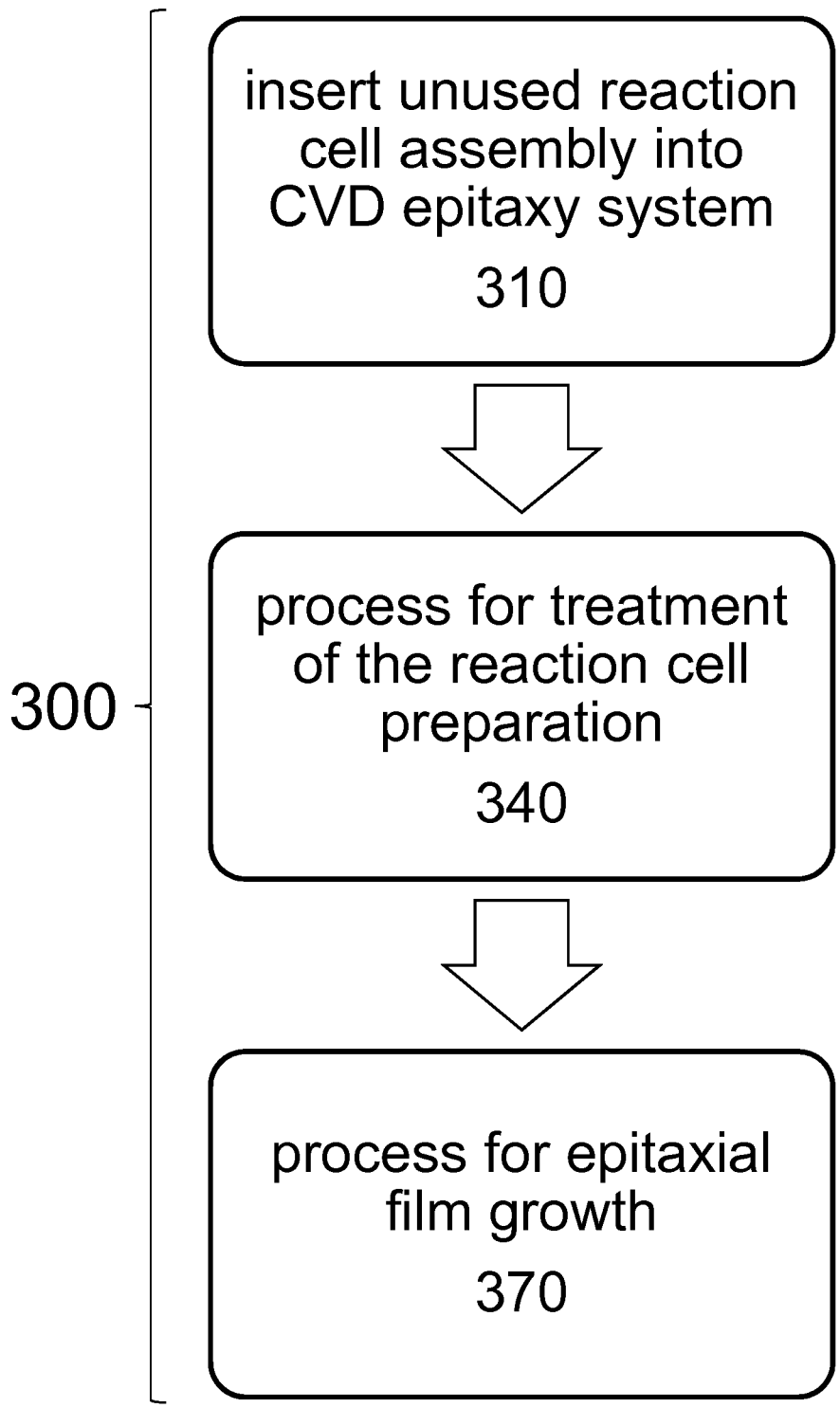
FIG. 3 is a flow chart illustrating an embodiment of a method of forming an epitaxial SiC film on a plurality of SiC substrates.
Figure 4:
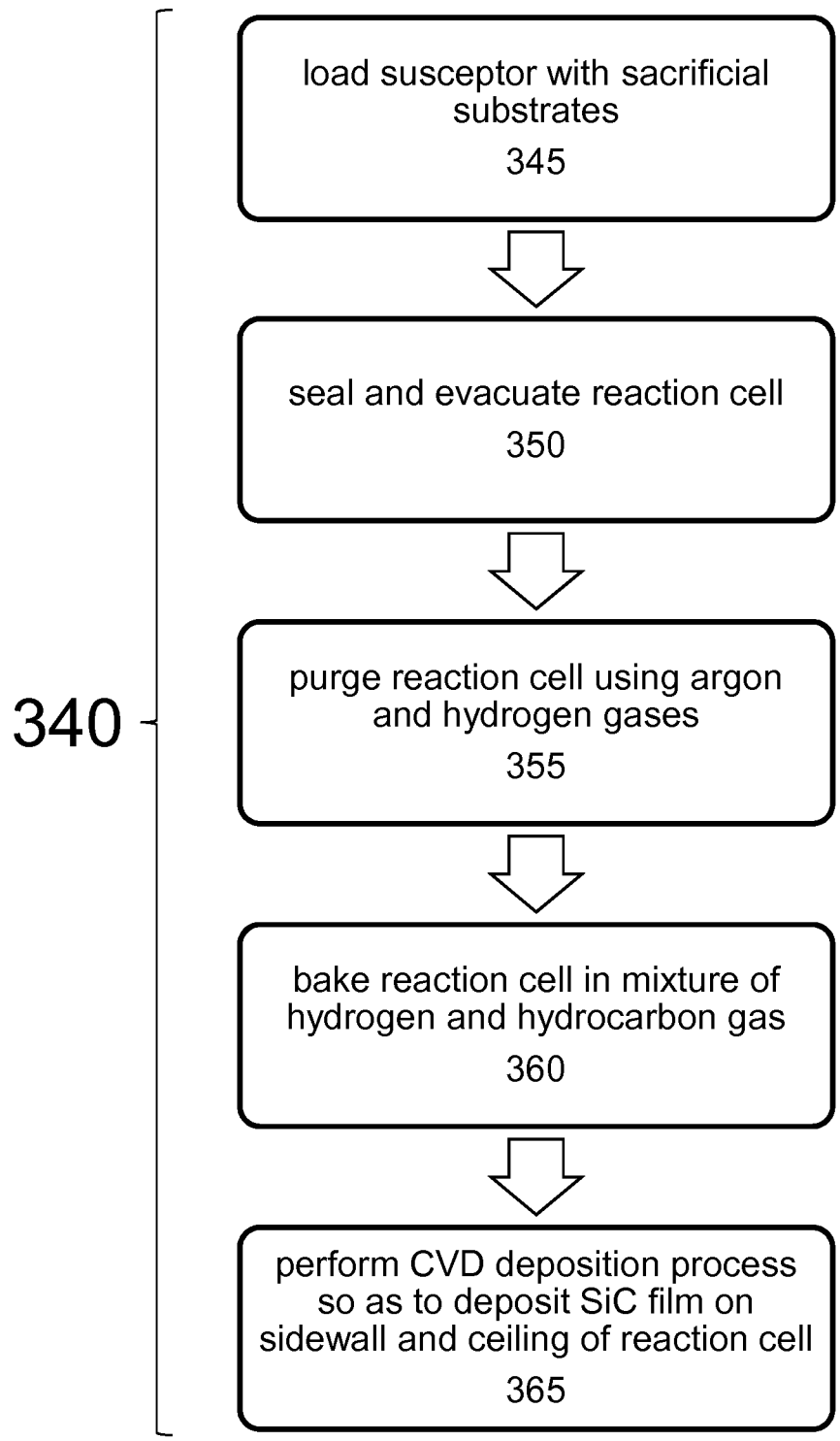
FIG. 4 is a flow chart illustrating an embodiment of a first process for treatment of the reaction cell preparation.
Figure 5:
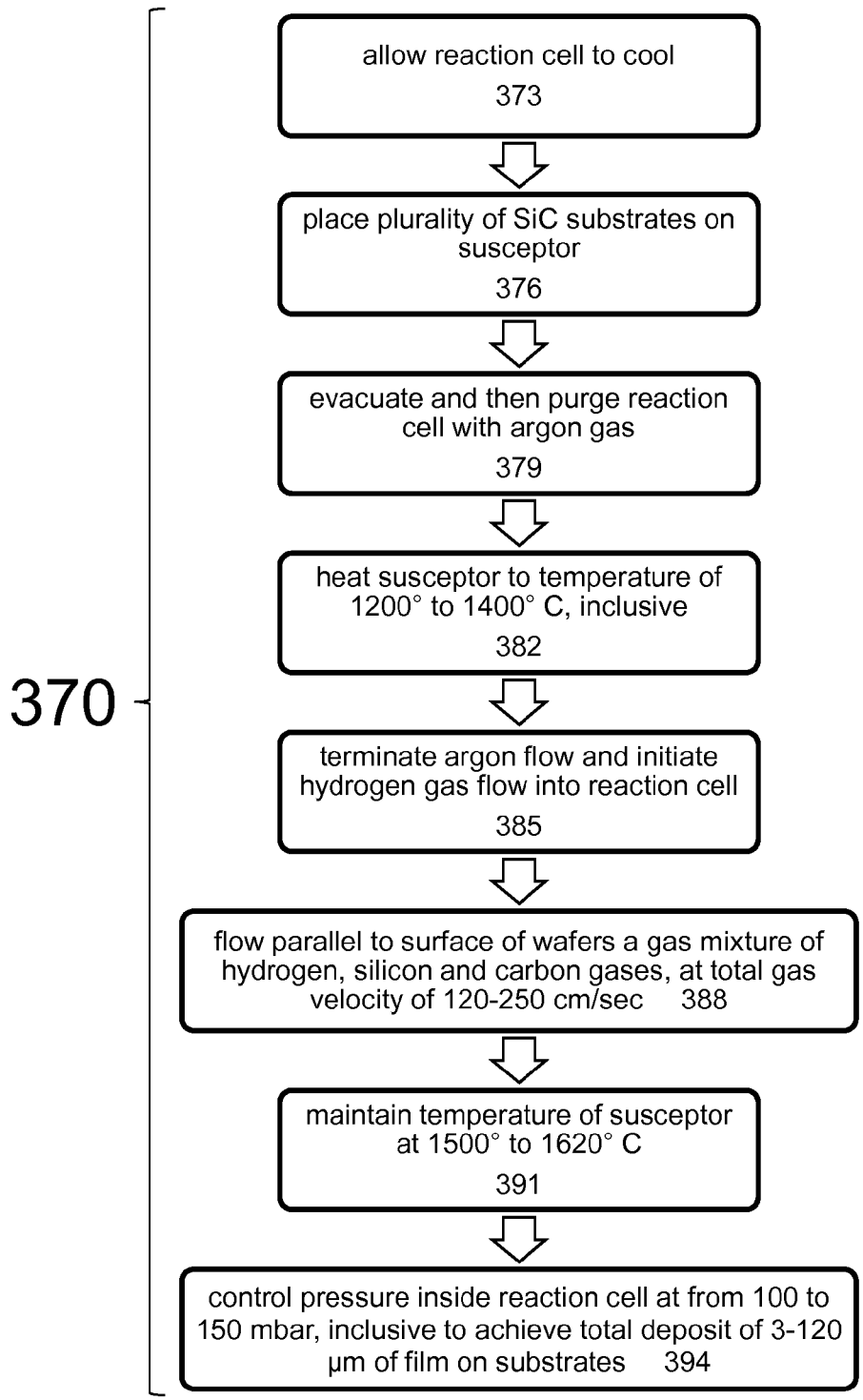
FIG. 5. Is a flow chart illustrating an embodiment of at least one second process for epitaxial film growth.

A new set of graphite consumables was loaded, baked and coated with a SiC layer as described. The substrates were loaded and processed. The process details and the results measured on a wafer from the process are:
Run ID/Wafer ID: A0971_AN2152-16
Growth temperature: 1530° C.
Pressure: 200 mbar
Total $H_2$ flow: 126 slpm
Film Thickness: 7 µm, within wafer range 6.4%
Film Doping: $5.7\times10^{15}/cm^3$, within wafer range 15.7%
Defect density: 0.83 $cm^{-2}$
RMS roughness 0.30 nm FIGS. 3, 4 and 5 depict an example of a method 300 of forming an epitaxial SiC film on a plurality of SiC substrates. The SiC substrates can be positioned on a susceptor in a warm wall CVD system, the warm wall CVD system having a reaction cell comprising a susceptor positioned at a bottom, a sidewall, and a ceiling. The susceptor can be actively heated, and the ceiling and sidewall are not actively heated, but are allowed to be indirectly heated by the susceptor. The method 300 can comprise inserting an unused reaction cell assembly into a CVD epitaxy system 310; a first process for treatment of the reaction cell preparation 340 (FIG. 4); and at least one second process for epitaxial film growth 370 (FIG. 5). Here, the term "epitaxial film growth" and the like is understood to include, for example, executing a manufacturing run to produce an SiC coated epiwafer, which is to be distinguished from pre-epitaxy steps.

The first process for treatment of the reaction cell preparation 340 can comprise steps of loading the susceptor with sacrificial substrates 345; sealing and evacuating the reaction cell 350; purging the reaction cell using argon and hydrogen gases 355; baking the reaction cell in a mixture of hydrogen and hydrocarbon gas 360; and performing a CVD deposition process so as to deposit SiC film on the sidewall and ceiling of the reaction cell 365.

The at least one second process for epitaxial growth 370 can comprise the steps of allowing the reaction cell to cool 373; placing a plurality of SiC substrates on the susceptor 376; evacuating and then purging the reaction cell with argon gas 379; heating the susceptor to a temperature of 1200° C. to 1400° C., inclusive 382; terminating the argon flow and initiating hydrogen gas flow into the reaction cell 385; flowing parallel to the surface of the wafers a gas mixture of hydrogen, silicon and carbon gases, at total gas velocity of 120 to 250 cm/sec 388; maintaining the temperature of the susceptor at 1500° C. to 1620° C. 391; and controlling pressure inside the reaction cell at from 100 to 150 mbar, inclusive to achieve a total deposit of 3 to 120 μm of film on the substrates 394.

Figure 6:
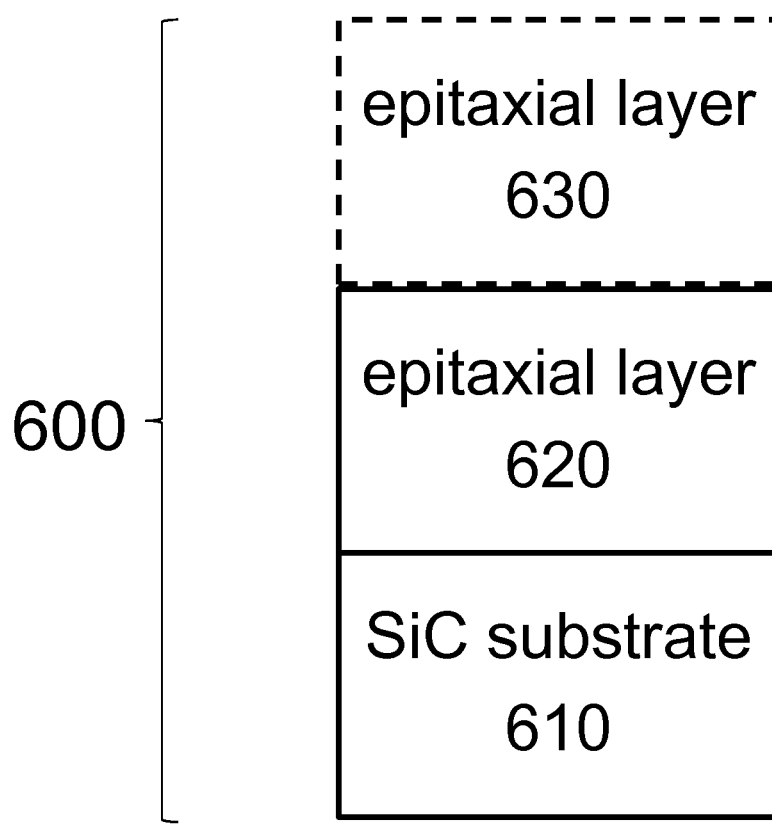
FIG. 6 depicts an embodiment of a single-crystal hexagonal SiC substrate with at least one epitaxial layer formed according to the method illustrated in FIGS. 3 to 5.

The method 300 can be used to form an apparatus 600 (FIG. 6) comprising a single-crystal hexagonal SiC substrate 610 with at least one epitaxial layer 620 produced by the method 300. Alternately, more than one epitaxial layer 620, 630, etc. can be formed on the substrate 610. In the apparatus 600, the within wafer total thickness variation can be from 2 to 12%, inclusive; the within wafer dopant concentration of each layer can be from 5 to 40%, inclusive; the top surface of the film can have an RMS roughness value of 0.2 to 1.2 nm; inclusive; and the density of surface defects on the film can be from 0.25 to 2.0/cm$^2$, inclusive.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention, including the extension of the method to larger CVD systems accommodating multiple substrates with diameter >=150 mm.

Although some of various drawings illustrate a number of logical stages in a particular order, stages which are not order dependent can be reordered and other stages can be combined or broken out. Alternative orderings and groupings, whether described above or not, can be appropriate or obvious to those of ordinary skill in the art.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

We claim:

1. A method of manufacturing a 4H-SiC epiwafer comprising an epitaxial SiC film on a single-crystal 4H-SiC substrate, the method comprising:
   a. loading the single-crystal 4H-SiC substrate onto a susceptor in a reaction cell of a warm wall CVD system;
   b. heating the system by controlling a temperature of the susceptor in the reaction cell to a range from 1500° C. to 1620° C. while establishing a temperature gradient from a surface of the epiwafer to a ceiling of the reaction cell in a range from 25° C./cm to 80° C./cm; and
   c. executing a manufacturing run to produce the 4H-SiC epiwafer, the manufacturing run comprising supplying a gas flow parallel to a surface of the single-crystal 4H-SiC substrate, such that a total gas velocity is in a range from 120 to 250 cm/sec and controlling a pressure inside the reaction cell to a range from 100 to 150 mbar, wherein the gas flow comprises a mixture of hydrogen gas, silicon gas, and carbon gas, in order to produce the epitaxial SiC film on the single-crystal 4H-SiC substrate.

2. The method of claim 1, wherein the single-crystal 4H-SiC substrate comprises a polished 4H-SiC wafer with a diameter ranging from 100 to 200 mm and having a nitrogen concentration of at least $1 \times 10^{18}/\text{cm}^3$.

3. The method of claim 1, wherein the epitaxial SiC film is deposited on an exposed silicon surface of the single-crystal 4H-SiC substrate.

4. The method of claim 1, wherein the epitaxial SiC film is deposited on an exposed carbon surface of the single-crystal 4H-SiC substrate.

5. The method of claim 1, wherein in step (a), a plurality of single-crystal 4H-SiC substrates are placed in the reaction cell.

6. A method of manufacturing a 4H-SiC epiwafer comprising an epitaxial SiC filer on a single-crystal 4H-SiC substrate, the method comprising:
   a. loading the single-crystal 4H-SiC substrate onto a susceptor in a reaction cell of a warm wall CVD system;
   b. heating the system by controlling a temperature of the susceptor in the reaction cell to a range from 1500° C. to 1620° C.; and
   c. executing a manufacturing run to produce the 4H-SiC epiwafer, the manufacturing run comprising supplying a gas flow parallel to a surface of the single-crystal 4H-SiC substrate, such that a total gas velocity is in a range from 120 to 250 cm/sec and controlling a pressure inside the reaction cell to a range from 100 to 150 mbar, wherein the gas flow comprises a mixture of hydrogen gas, silicon gas, and carbon gas, in order to produce the epitaxial SiC film on the single-crystal 4H-SiC substrate; and,
   further comprising:
   d. measuring performance metrics of the 4H-SiC epiwafer; and
   e. removing the used reaction cell when the measured performance metrics of the 4H-SiC epiwafer fall below acceptable threshold limits.

7. A method of manufacturing a 4H-SiC epiwafer comprising an epitaxial SiC film on a single-crystal 4H-SiC substrate, the method comprising:
   a. loading the single-crystal 4H-SiC substrate onto a susceptor in a reaction cell of a warm wall CVD system:
   b. heating the system by controlling a temperature of the susceptor in the reaction cell to a range from 1500° C. to 1620° C.; and
   c. executing a manufacturing run to produce the 4H-SiC epiwafer, the manufacturing run comprising supplying a gas flow parallel to a surface of the single-crystal 4H-SiC substrate, such that a total gas velocity is in a range from 120 to 250 cm/sec and controlling a pressure inside the reaction cell to a range from 100 to 150 mbar, wherein the gas flow comprises a mixture of hydrogen gas, silicon gas, and carbon gas, in order to produce the epitaxial SiC film on the single-crystal 4H-SiC substrate;
   wherein step (a) is preceded by pre-treating the reaction cell, the pre-treating comprising:

a. loading a sacrificial substrate onto the susceptor in the reaction cell;
b. sealing and evacuating the reaction cell;
c. purging the reaction cell using inert and hydrogen gases;
d. baking the reaction cell at a temperature in the range 1400° C. to 1700° C. while flowing hydrogen gas mixed with 1% to 10% hydrocarbon gas;
e. performing a CVD deposition process so as to deposit an SiC film on the sidewall and ceiling of the reaction cell; and
f. removing the sacrificial substrate from the reaction cell.

8. A method of manufacturing a 4H-SiC epiwafer comprising an epitaxial SiC film on a single-crystal 4H-SiC substrate, the method comprising:
a, loading the single-crystal 4H-SiC substrate onto a susceptor in a reaction cell of a warm wall CVD system;
b. heating the system by controlling a temperature of the susceptor in the reaction cell to a range from 1500° C. to 1620° C.; and
c. executing a manufacturing run to produce the 4H-SiC epiwafer, the manufacturing run comprising supplying a gas flow parallel to a surface of the single-crystal 4H-SiC substrate, such that a total gas velocity is in a range from 120 to 250 cm/sec and controlling a pressure inside the reaction cell to a range from 100 to 150 mbar, wherein the gas flow comprises a mixture of hydrogen gas, silicon gas, and carbon gas, in order to produce the epitaxial SiC film on the single-crystal 4H-SiC substrate;
wherein step (c) comprises:
a. placing the single-crystal 4H-SiC substrate on the susceptor in the reaction cell of the warm wall CVD system;
b. evacuating the reaction cell and then purging the reaction cell with argon;
c. terminating the argon flow and initiating hydrogen gas flow into the reaction cell;
d. establishing the temperature gradient from the surface of the epiwafer to a ceiling of the reaction cell in the range from 25° C./cm to 80° C./cm;
e. flowing parallel to the surface of the epiwafer a gas mixture of hydrogen, silicon and carbon gases, at a total gas velocity of 120 to 250 cm/sec;
f. maintaining the process conditions to achieve a total deposit of from 3 to 120 μm of film on the single-crystal 4H-SiC substrate in order to produce the epitaxial SiC film on the single-crystal 4H-SiC substrate;
g. cooling the system to a temperature less than 300° C.; and
h. removing the single-crystal 4H-SiC substrate.

9. The method of claim 8, wherein the gas flow further comprises doping gas.

10. The method of claim 8, further comprising flowing an etching gas mixture into the reaction cell to etch the single-crystal 4H-SiC substrate prior to step 5(e).

11. The method of claim 10, wherein the etching gas mixture comprises a halogen gas and hydrogen.

12. A method of manufacturing a 4H-SiC epiwafer comprising an epitaxial SiC film on a single-crystal 4H-SiC substrate, the method comprising:
a. loading the single-crystal 4H-SiC substrate onto a susceptor in a reaction cell of a warm wall CVD system;
b. heating the system by controlling a temperature of the susceptor in the reaction cell to a range from 1500° C. to 1620° C.; and
c. executing a manufacturing run to produce the 4H-SiC epiwafer, the manufacturing run comprising supplying a gas flow parallel to a surface of the single-crystal 4H-SiC substrate, such that a total gas velocity is in a range from 120 to 250 cm/sec and controlling a pressure inside the reaction cell to a range from 100 to 150 mbar, wherein the gas flow comprises a mixture of hydrogen gas, silicon gas, and carbon gas, in order to produce the epitaxial SiC film on the single-crystal 4H-SiC substrate;
wherein the reaction cell comprises a graphite reaction cell, and further comprises coating the reaction cell's graphite components with pyrocarbon or tantalum carbide films prior to assembling the cell for use in CVD epitaxy.

13. A single-crystal 4H-SiC substrate with epitaxial SiC film produced by the method comprising:
a. loading the single-crystal 4H-SiC substrate a e onto a susceptor in a reaction cell of a warm wall CVD system;
b. heating the system by controlling a temperature of the susceptor in the reaction cell to a range from 1500'C. to 1620° C.; and
c. executing a manufacturing run to produce the 4H-SiC epiwafer, the manufacturing run comprising supplying a gas flow parallel to a surface of the single-crystal 4H-SiC substrate, such that a total gas velocity is in a range from 120 to 250 cm/sec and controlling a pressure inside the reaction cell to a range from 100 to 150 mbar, wherein the gas flow comprises a mixture of hydrogen gas, silicon gas, and carbon gas, in order to produce the epitaxial SiC film on the single-crystal 4H-SiC substrate; wherein,
a. a within wafer total thickness variation of the epitaxial SiC film is from 2 to 12%, inclusive;
b. a within wafer dopant concentration variation of the epitaxial SiC film is from 5 to 40%, inclusive;
c. a top surface of the epitaxial SiC film has an RMS roughness value of 0.2 to 2 nm; inclusive; and
d. a density of surface defects on the epitaxial SiC film is from 0.25 to 2.0/cm2, inclusive.

14. A method of forming a 4H-SiC epiwafer comprising an epitaxial SiC film on a single-crystal 4H-SiC substrate positioned on a susceptor in a warm wall CVD system, the warm wall CVD system having a reaction cell comprising the susceptor positioned at a bottom, a sidewall, and a ceiling, wherein the susceptor is actively heated, and the ceiling and sidewall are not actively heated, but are allowed to be indirectly heated by the susceptor, the method comprising:
a. inserting an unused reaction cell assembly into a CVD epitaxy system;
b. a first process for treatment of the reaction cell preparation; and
c. a second process for epitaxial film growth;
wherein:
the first process for treatment of the reaction cell preparation comprises the steps:
i. loading the susceptor with a sacrificial substrate;
ii. sealing and evacuating the reaction cell;
iii. purging the reaction cell using argon and hydrogen gases;
iv. baking the reaction cell in a mixture of hydrogen and hydrocarbon gas; and
v. performing a CVD deposition process so as to deposit an SiC film on the sidewall and ceiling of the reaction cell;
and
the second process for epitaxial film growth comprises the steps:
vi. allowing the reaction cell to cool;
vii. placing the single-crystal 4H-SiC substrate on the susceptor;

viii. evacuating and then purging the reaction cell with argon gas;

ix. heating the susceptor to a temperature of 1200° C. to 1400° C., inclusive;

x. terminating the argon flow and initiating hydrogen gas flow into the reaction cell;

xi. flowing parallel to the surface of the wafers a gas mixture of hydrogen, silicon and carbon gases, at a total gas velocity of 120 to 250 cm/sec;

xii. maintaining a temperature of the susceptor at 1500° C. to 1620° C.; and xiii. controlling a pressure inside the reaction cell at from 100 to 150 mbar, inclusive, to achieve a total deposit of 3 to 120 μm of film on the substrate.

15. The method of claim 14, wherein the step of baking the unused reaction cell comprises heating the reaction cell to a temperature of from 1400° C. to 1700° C. and maintaining the temperature for from 4 to 24 hours.

16. The method of claim 14, wherein during the first process for treatment of the reaction cell preparation. a ratio of volumetric flow of carbon to silicon gases, taken as the ratio of (number of C atoms in precursor molecule)×(carbon volume flow)/(silicon volume flow) is less than 1, but greater than 0.05.

17. The method of claim 14, wherein the temperature of the susceptor, the total gas velocity, and a throttle setting of the reaction cell are controlled so as to maintain a temperature gradient from the substrate to the ceiling in a range from 25° C./cm to 80° C./cm.

18. The method of claim 14, wherein the total gas velocity is maintained at 120 to 160 cm/sec, inclusive.

19. The method of claim 14, wherein the total gas velocity is maintained at 175 to 250 cm/sec, inclusive.

20. The method of claim 14, wherein a plurality of single-crystal 4H-SiC substrates are placed in the reaction cell.

* * * * *

UNITED STATES PATENT AND TRADEMARK OFFICE
CERTIFICATE OF CORRECTION

| | | |
|---|---|---|
| PATENT NO. | : 8,940,614 B2 | Page 1 of 1 |
| APPLICATION NO. | : 14/213888 | |
| DATED | : January 27, 2015 | |
| INVENTOR(S) | : Mark J. Loboda and Jie Zhang | |

It is certified that error appears in the above-identified patent and that said Letters Patent is hereby corrected as shown below:

In the claims

In Column 14, Line 25 (Claim 6, Line 2), please delete "filer" and insert -- film --, therefor.

In Column 15, Line 54 (Claim 10, Line 3), please delete "5 e)" and insert -- e) --, therefor.

In Column 16, Line 14 (Claim 13, Line 3), please delete "sing1e" and insert -- single --, therefor.

In Column 16, Line 14 (Claim 13, Line 3), please delete "a e".

In Column 18, Line 2 (Claim 16, Line 2), please delete "preparation." and insert -- preparation, --, therefor.

Signed and Sealed this
Twentieth Day of October, 2015

Michelle K. Lee
*Director of the United States Patent and Trademark Office*